(12) United States Patent
Klein et al.

(10) Patent No.: US 7,126,424 B2
(45) Date of Patent: Oct. 24, 2006

(54) INTERFACE CIRCUIT FOR CONNECTING TO AN OUTPUT OF A FREQUENCY CONVERTER

(75) Inventors: Peter Klein, Kolbermoor (DE); Bernhard Lustig, Munich (DE); Dieter Sewald, Au (CH)

(73) Assignee: Infineon Technologies Inc., Munich (DE)

(*) Notice: Subject to any disclaimer, the term of this patent is extended or adjusted under 35 U.S.C. 154(b) by 162 days.

(21) Appl. No.: 10/482,720

(22) PCT Filed: Jul. 2, 2002

(86) PCT No.: PCT/DE02/02408

§ 371 (c)(1),
(2), (4) Date: Aug. 13, 2004

(87) PCT Pub. No.: WO03/005561

PCT Pub. Date: Jan. 16, 2003

(65) Prior Publication Data

US 2005/0077962 A1    Apr. 14, 2005

(30) Foreign Application Priority Data

Jul. 6, 2001    (DE) ................. 101 32 803

(51) Int. Cl.
*H03F 3/45*    (2006.01)
(52) U.S. Cl. ..................... 330/258
(58) Field of Classification Search ........... None
See application file for complete search history.

(56) References Cited

U.S. PATENT DOCUMENTS

| | | | |
|---|---|---|---|
| 4,667,165 A * | 5/1987 | De Weck | 330/253 |
| 5,015,966 A * | 5/1991 | McIntyre | 330/253 |
| 5,294,893 A | 3/1994 | Ryat | |
| 5,319,316 A * | 6/1994 | Fensch | 330/253 |
| 5,557,238 A | 9/1996 | Weiss | |
| 5,613,233 A | 3/1997 | Vagher | |
| 5,872,446 A | 2/1999 | Cranford, Jr. et al. | |
| 6,476,675 B1 * | 11/2002 | Sun | 330/253 |
| 6,538,512 B1 * | 3/2003 | Sun | 330/253 |
| 6,621,342 B1 * | 9/2003 | Giduturi | 330/253 |
| 6,642,788 B1 * | 11/2003 | Abughazaleh | 330/253 |

FOREIGN PATENT DOCUMENTS

| | | |
|---|---|---|
| DE | 69316155 T2 | 5/1994 |
| DE | 69507659 T2 | 11/1995 |
| WO | 00/70756 | 11/2000 |

OTHER PUBLICATIONS

Steyaert, Michel S. J., et al.: "A 2-V CMOS Cellular Transceiver Front-End", IEEE Journal of Solid-State Circuits, vol. 35, No. 12, Dec. 2000, pp. 1895-1907.

Lee, Thomas H.: "The Design of CMOS Radio-Frequency Integrated Circuits", Cambridge University Press 1998, Section 12.4 Multiplier-Based Mixers, pp. 318-319.

* cited by examiner

*Primary Examiner*—Robert Pascal
*Assistant Examiner*—Krista M. Flanagan
(74) *Attorney, Agent, or Firm*—Eschweiler & Associates, LLC

(57) ABSTRACT

In an interface circuit for connection to an output of a frequency converter, at least two current paths are coupled to one another in parallel. Each current path includes at least one cascode stage for signal processing. The circuit compensates for DC voltage offsets of the frequency converter, and has a gain ratio that can be changed over for signals with a large dynamic range.

19 Claims, 2 Drawing Sheets

INTERFACE CIRCUIT FOR CONNECTING TO AN OUTPUT OF A FREQUENCY CONVERTER

FIELD OF THE INVENTION

The present invention relates to an interface circuit for connection to an output of a frequency converter.

BACKGROUND OF THE INVENTION

In radio frequency receivers, Gilbert-type mixers are preferably used for converting the radio frequency transmission signals to the baseband. Said mixers may be constructed using analog circuit technology, using bipolar technology or using metal oxide semiconductor, MOS, technology. At the output of such mixers or frequency converters, the down-converted output signal, which also still contains radio frequency residues in addition to the useful signal, is initially ready as an output current.

In order to provide the downstream signal processing chain with an output signal from which the radio frequency residues have been eliminated, it is customary additionally to convert the output current into a voltage at a resistor in the output current branch of the Gilbert mixer, so that the radio frequency residues can be effectively dissipated via capacitances. In the case of the small operating voltages customary in modern circuit integration technologies in CMOS, the resistor described greatly reduces the available voltage swing at the mixer transistors and thus the achievable power, conversion and signal-to-noise ratio of the mixer as a result of the voltage drop across such a resistor. However, without conversion of the mixer current into a voltage, the radio frequency residues would be forwarded to the downstream signal processing chain.

A mixer circuit of this type with a low-noise amplifier connected upstream is specified in FIG. 2 of the document A 2-V CMOS Cellular Transceiver Front-End, Steyaert et al., IEEE Journal of Solid-State Circuits, Vol. 35, No. 12, December 2000, pp. 1895 to 1907.

At resistors connected to the output of the mixer stage specified in FIG. 2, a differential voltage would be forwarded to downstream stages with a high input resistance, with the disadvantages described above, which voltage builds up at the nonreactive load resistors, which have a low resistance relative to the output resistors of the mixer M5, M6, and the parallel-connected load capacitances for generating a common-mode level for DC voltage offset compensation.

In order, for the reasons described above, to send the differential current of the mixer transistors to a downstream circuit with a low input resistance, this current has to be conducted via feedback resistors which are needed for the generation of the low input resistance ("virtual ground"). In order, however, at the same time to achieve the required RC time constants of 10 µs, for example, as are usually required for channel selection in the baseband, it would be necessary to construct disproportionately large capacitances, the integration of which cannot be realized in practice using CMOS technology.

In the case of the above-described direct conversion of the radio frequency transmission signals into the baseband, comparatively large currents, typically of the order of magnitude of a few milliamperes, are required in order to suppress the comparatively large 1/f noise in the case of MOS transistors. In the case of CMOS maximum voltages of 1 V, for example, this leads to load resistances of a few 100 Ω. An RC time constant of 10 µs would accordingly require capacitances of a few 10 nF, that is to say a chip area of approximately a few 10 mm² which would be a cost-intensive solution in particular in the case of large-scale integrated CMOS circuits. Moreover, radio frequency components still present would additionally have to be eliminated from the output signal, which would likewise necessitate the provision of large capacitances, which would again require additional chip area.

The document DE 69 31 61 55 specifies a circuit arrangement with two current paths each comprising a cascode stage. The output current is divided between the two paths. Detection of the common-mode level with corresponding feedback is additionally provided.

It is an object of the present invention to specify an interface circuit for connection to an output of a frequency converter which forwards the baseband useful signals as current to downstream circuits but not the radio frequency residues, in order that the latter can be effectively dissipated via capacitances, compensates for the DC offset of the frequency converter, encompasses a large dynamic range, offers downstream circuits a defined output signal level, enables programmable gain without additional current, and at the same time can be produced cost-effectively.

SUMMARY OF THE INVENTION

The present invention provides an interface circuit for connection to an output of a frequency converter, having a signal input; a signal output; a first current path, which couples the signal input to the signal output and comprises at least one cascode stage; a second current path, which comprises a cascode stage connected in parallel with the cascode stage of the first current path; a connection for providing a common-mode signal which is arranged in the first or in the second current path, and a third current path, which comprises a cascode stage coupled in a parallel circuit with the cascode stages of the first and second current paths, the cascode stages in the second and third current paths each having a control input connected to a bias stage for changing over between the second and third current paths.

The present subject matter is based on the insight that dividing the input current which can be fed in at the signal input of the interface circuit between at least two current paths affords advantageous effects on the signal-to-noise ratio, the accessible dynamic range, and also the utilization of the available supply voltage, particularly in CMOS circuit technology.

According to the invention, by way of example, the first current path may be designed for providing an output current at the signal output, while the second current path has the connection for providing a common-mode signal.

In an alternative embodiment, the first current path may have both the current output and the output for providing the common-mode signal. In this case, a current divider is preferably provided, which can be used to obtain a desired gain or attenuation of the output signal.

The provision of further current branches additionally enables a further improved adaptation to a large dynamic range of a signal present at the input as a result of the possibility of changing over between different current paths with a different or identical gain or attenuation ratio of the current to be processed.

The present circuit is particularly suitable by way of its signal input for connection to the output of a frequency converter, for example a frequency converter formed using CMOS circuit technology. The invention can preferably be used in radio frequency receivers which operate according to the principle of direct conversion to the baseband.

The current division ratio or the gain or attenuation ratio of the current can be altered arbitrarily and also dynamically with the present circuit.

Since the circuit has an output for providing a common-mode signal, DC voltage offsets, which can usually occur in analog multipliers, can be compensated for in a simple manner.

Since the present circuit carries a signal in the current range without additional voltage nodes, the ratio of useful to offset voltages is significantly improved in filter and amplifier circuits downstream of the interface circuit.

The signal-to-noise ratio of the useful signal is considerably increased in the present interface circuit because the voltage amplitude of the useful signal remains small without the signal-to-noise ratio decreasing.

Since, with the present circuit, a small output current can be provided even when the input signal has a large dynamic range, it is possible to construct circuits in the further signal processing in the baseband, which are coupled to the output of the interface circuit, with a particularly small area and/or current requirement, so that the current requirement of the receiver is reduced overall. As a result of this, the present circuit is particularly suitable for application in mobile radio frequency receivers.

In one preferred embodiment of the present invention, a bias stage is provided, with an output coupled in each case to control inputs of the cascode stages in the first and second current paths, for supplying a respective bias voltage.

The bias stage coupled to the cascode stages makes it possible, on the one hand, to disconnect the current paths in a current-saving mode and, on the other hand, individual current paths can be connected or disconnected, for example in order to change over the gain or attenuation of the output current.

In a further preferred embodiment of the present invention, the bias stage has a control input for putting the interface circuit into a current-saving operating mode in a manner dependent on a control signal.

In particular when the circuit is employed in the mobile sector, that is to say as a mobile radio receiver, for example, a significantly longer battery or accumulator service life may be obtained in order to turn off the interface circuit or in order to provide a standby mode.

In a further preferred embodiment of the present invention, a third current path is provided, which comprises a cascode stage coupled in parallel with the cascode stages of the first and second current paths, the cascode stages in the second and third current paths having a control input connected to the bias stage for changing over between the second and third current path.

In the preferred embodiment described, the first current path is on the one hand coupled to the signal output for providing the output current and on the other hand has the connection for providing a common-mode level.

In a further preferred embodiment of the present invention, a current divider is provided, which couples the signal output, the connection for providing a common-mode signal and the cascode stage in the first current path. The desired attenuation of the output current can be set by means of the current divider.

In a further preferred embodiment of the present invention, a control loop for common-mode rejection is provided, with a control input connected to the connection for providing a common-mode signal and with an output coupled to the signal input of the interface circuit.

By way of example, a differential amplifier may be provided in the control loop, to which differential amplifier the common-mode signal provided as described can be fed at one input and a desired common-mode voltage, for example half the supply voltage, can be fed at another input.

In a further preferred embodiment of the present invention, the control loop for common-mode rejection comprises means for control circuit stabilization.

In order to prevent an undesirable oscillation of the circuit, by way of example, a series circuit comprising a resistance and a capacitance may be connected in the control circuit.

In a further preferred embodiment of the present invention, the signal input, the signal output and the current paths are designed for processing symmetrical signals.

Such a differential construction enables a large signal-to-noise ratio particularly in large-scale integrated CMOS circuits. Moreover, a large dynamic range of 90 dB, for example, can be covered at the same time.

The invention is explained in more detail below using two exemplary embodiments with reference to the drawings.

DETAILED DESCRIPTION

Figure 1:
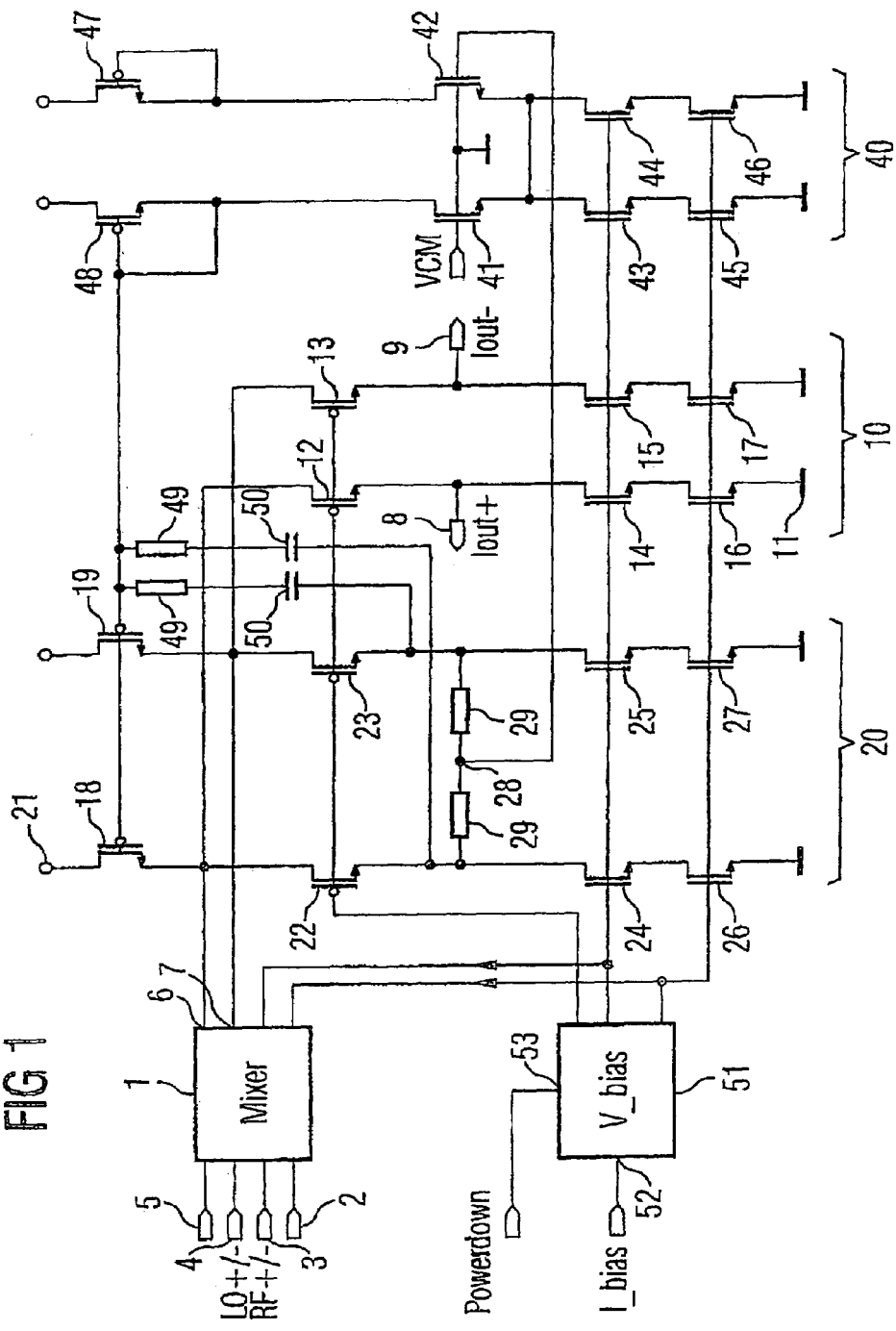
FIG. 1 shows an exemplary embodiment of an interface circuit with two parallel folded cascode stages on the basis of a simplified circuit diagram.

The reference symbols in the drawings are:

LIST OF REFERENCE SYMBOLS

1 Frequency converter
2 RF input
3 RF input
4 LO input
5 LO input
6 Input
7 Input
8 Output
9 Output
10 First current path
11 Reference potential connection
12 PMOS-FET
13 PMOS-FET
14 NMOS-FET
15 NMOS-FET
16 NMOS-FET
17 NMOS-FET
18 PMOS-FET
19 PMOS-FET
20 Second current path
21 Supply potential connection
22 PMOS-FET
23 PMOS-FET
24 NMOS-FET
25 NMOS-FET
26 NMOS-FET
27 NMOS-FET
28 Common-mode signal connection
29 Resistor
30 Third current path
31 Resistor 32 PMOS-FET
33 PMOS-FET
34 NMOS-FET
35 NMOS-FET
36 NMOS-FET
37 NMOS-FET
40 Control loop
41 NMOS-FET
42 NMOS-FET
43 NMOS-FET
44 NMOS-FET
45 NMOS-FET
46 NMOS-FET
47 PMOS diode
48 Current mirror transistor
49 Resistor
50 Capacitance
51 Bias stage
52 Input
53 Input
54 Input
55 Resistor.

FIG. 1 shows an interface circuit constructed using CMOS circuit technology for connection to an output of a frequency converter 1.

If the receiver has an architecture for processing complex-valued signals, then circuits in accordance with FIG. 1 are to be provided in each case for an in-phase and quadrature branch.

The frequency converter 1, constructed as a Gilbert-type down-converter, has two input terminal pairs 2 to 5, it being possible to feed in a radio frequency signal as symmetrical signal at the input terminal pair 2, 3, which signal couples into a reception antenna, for example. The frequency converter down-converts said signal into the baseband using a local oscillator signal, the local oscillator signal likewise being able to be fed in as symmetrical signal at the input terminals 4, 5. The frequency converter 1 provides this down-converted signal as a current signal at its output 6, 7.

The signal output of the frequency converter 6, 7 is at the same time the signal input 6, 7 of the interface circuit according to the invention, which conditions the output signal of the mixer for further signal processing.

At its signal output 8, 9, the interface circuit provides the output signal conditioned in this way likewise as a current signal in a symmetrical output.

The interface circuit furthermore comprises a first current path, which couples the signal input 6, 7 to the signal output 8, 9 and is likewise constructed symmetrically. Between the signal input 6, 7 and a reference potential connection 11, the symmetrical first current path 10 comprises in each case a series circuit formed by a p-channel MOS cascode transistor 12, 13, an n-channel MOS cascode transistor 14, 15 and, on the reference potential side, an n-channel MOS transistor 16, 17, which operates as a current source transistor. Two PMOS current source transistors 18, 19 are provided on the supply potential side and respectively couple the PMOS cascode transistors 12, 13 to the supply potential connection 21. The PMOS current source transistors 18, 19 are simultaneously current sources for a second current path 20 connected in parallel with the first current path between signal input 6, 7 and reference potential connection 11. The PMOS current source transistors 18, 19 accordingly distribute the current which they provide between the first and second current branches 10, 20. Like the first current branch 10, the second current branch 20 has, in a symmetrical construction, in each case a series circuit formed by PMOS cascode transistors 22, 23, NMOS cascode transistors 24, 25 and current source transistors using NMOS technology 26, 27, said series circuits respectively coupling the PMOS current sources 18, 19 to the reference potential connection 11. The second current branch 20 furthermore has a connection for providing a common-mode signal 28, which, in the case of corresponding further processing, as explained later, serves for DC voltage offset compensation. For this purpose, the connection 28 is connected via a respective resistor 29 to a respective circuit node of the symmetrically formed second current path, namely in each case between source connection of the PMOS cascode transistors 22, 23 and drain connection of the NMOS cascode transistors 24, 25.

The interface circuit furthermore comprises a control loop 40, which serves to compensate for DC voltage offsets which are usually caused by analog multipliers such as the mixer 1. A differential amplifier stage is provided in this case, comprising two NMOS transistors 41, 42, connected to one another on the source side, it being possible for a desired common-mode signal VCM to be fed to the NMOS transistor 41 and the gate connection of the further NMOS differential amplifier transistor 42 to be connected to the connection for providing the common-mode signal 28.

The so-called bulk connections of the differential amplifier transistors 41, 42 are in each case connected to the reference potential connection 11. The common source connection of the differential amplifier 41, 42 is connected to the reference potential connection 11 via a parallel circuit comprising two series circuits of in each case two NMOS transistors 43 to 46. On the drain side, one of the NMOS differential amplifier transistors 42 is connected to the supply potential connection 21 via a PMOS transistor 47 connected as a diode. Via a current mirror transistor 48, the drain connection of the NMOS differential amplifier transistor 41 is on the one hand coupled to the reference potential connection 21 via the drain connection of said current mirror transistor and is on the other hand connected to the gate connections of the PMOS current source transistors 18, 19 via the gate connection of said current mirror transistor. For the stabilization of the control circuit, a respective series circuit formed by a resistor 49 and a capacitance 50 is furthermore connected on the one hand to the gate connection of the current mirror transistor 48 and on the other hand to the symmetrical circuit node between PMOS and NMOS cascode transistors 22 to 25 in the second current path 20.

For the driving of the PMOS and NMOS cascode transistors 22 to 25 and 12 to 15 and the NMOS current source transistors 16, 17, 26, 27 in the first and second current branches 10, 20, their gate connections are in each case connected to an output of a bias stage 51, which provides in each case a corresponding bias voltage for operating the transistors. For its functionality, the bias stage 51 can be fed a reference current at a current input 52. In order to put the interface circuit into a current-saving mode or turn it off, the bias stage 51 is equipped with a further input 53, at which a corresponding control signal can be fed in.

With the signal output 8, 9 in the first current path 10 of the present circuit, one part of the current present at the input 6, 7 is forwarded directly to a downstream circuit. A further part of the current, which is provided by the PMOS current sources 18, 19, flows into the second current path 20, which acts as a current sink, but at the same time has the connection 28 for providing a common-mode signal for offset compensation.

Dividing the comparatively large mixer current between a plurality of cascode stages which are in parallel with the mixer output and serve either for common-mode determination or for current outputting affords a more economical fully integrated CMOS receiver architecture. While the n-channel cascode transistors, principally for the suppression of parasitic poles, preferably have the shortest possible channel length, for example 0.4 µm, the p-channel cascode transistors have a comparatively large channel length, for example 2.5 µm for the transistors 22, 23 and 4 µm for the transistors 12, 13. This further reduces the so-called 1/f noise. Furthermore, parasitic RF (radio frequency) frequency components are eliminated from the output signal on account of the small limiting frequency of the long-channel transistors and the need for large and expensive smoothing capacitances is thus reduced.

In alternative embodiments, one of the cascode stages may also be obviated, for example the NMOS cascode transistors 14, 15, 24, 25 may be omitted from the circuit in accordance with FIG. 1.

However, the parallel folded cascode stages have at least one respective cascode transistor and one respective current source transistor which are connected in a series circuit.

The exemplary embodiment in accordance with FIG. 1 serves for connection to an n-channel mixer 1. If the mixer 1 is designed as a p-channel mixer, then the interface circuit is to be realized in a dual embodiment in a manner that is obvious to the person skilled in the art. The arrangement in accordance with FIG. 1 is to be mirrored for this purpose. Known exemplary embodiments of mixers for which the interface circuit in accordance with FIG. 1 is suitable are, by way of example, embodiments of Gilbert mixers which short-circuit intermediate frequency interference sources that possibly occur with a large amplitude via an output capacitance and supply a differential current as an output signal.

The above-described common-mode rejection including the stabilization resistors and capacitances 49, 50 is to be suitably dimensioned for reliable functionality or may be replaced by alternative circuits for common-mode rejection within the scope of the customary knowledge of a person skilled in the art in the relevant technical field.

In the exemplary embodiment shown, the bias stage 51 additionally supplies a symmetrical bias voltage for the frequency mixer 1 and, for this purpose, is connected to a further input of the frequency converter 1 on the output side.

Figure 2:
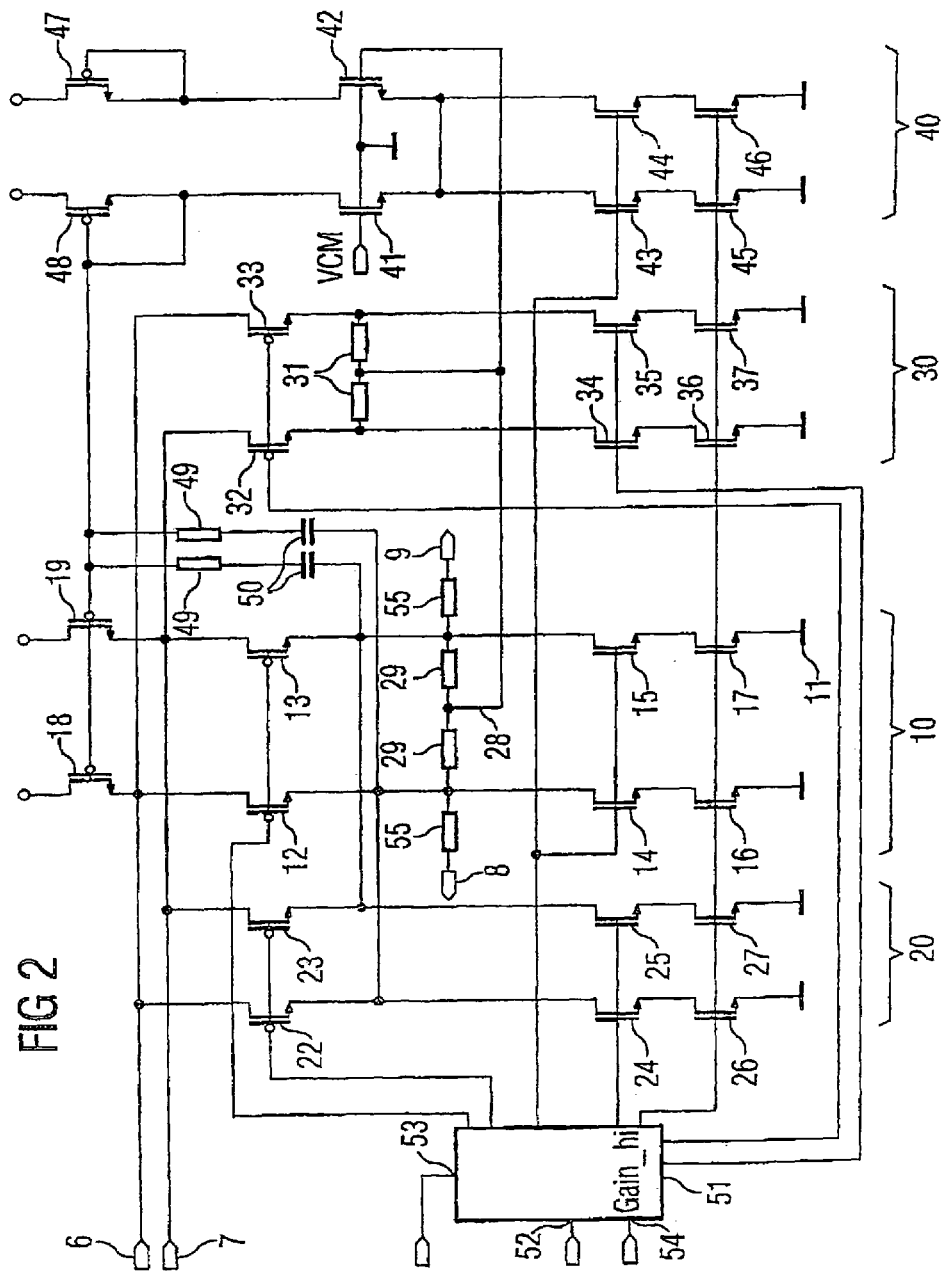
FIG. 2 shows a further exemplary embodiment of the invention with three parallel folded cascode stages on the basis of a simplified circuit diagram.

FIG. 2 shows a second exemplary embodiment of the present invention, which is designed particularly for processing input signals with particularly large dynamic range fluctuations of the input current, as they occur for example in the case of the GPRS or UMTS mobile radio standard.

The interface circuit in accordance with FIG. 2, which is a development of the circuit described in FIG. 1 likewise has a signal input 6, 7 of symmetrical design and also a signal output 8, 9 likewise of symmetrical design. A first current path 10 is likewise provided for coupling signal input and signal output 6, 7; 8, 9, which current path, as already described in FIG. 1, comprises a series circuit formed by jointly utilized PMOS current source transistors 18, 19, PMOS cascode transistors 12, 13, NMOS cascode transmitters 14, 15 and NMOS current source transistors 16, 17 in accordance with the interconnection already described in FIG. 1. In this case, the series circuits described are connected between the supply potential connection 21 and reference potential connection 11. A second current branch 20 is once again connected in parallel with said first current branch 10 and, as already described in FIG. 1, comprises a series circuit formed by cascode transistors using PMOS technology 22, 23, NMOS cascode transistors 24, 25 and NMOS current source transistors 26, 27, the PMOS current source transistors being jointly effective in the first and second current paths 10, 20 on the supply potential side.

In a departure from the circuit in accordance with FIG. 1, in the case of the embodiment in accordance with FIG. 2, however, the resistors 29 forming the connection 28 for providing the common-mode signal are not arranged in the second current path 20, but rather are arranged in the first current branch 10, where they form, with further resistors 55, a symmetrical current divider for the output signal of the interface circuit. It is assumed in this case that the output node is at low impedance, for example by feedback of the downstream circuit to the said node. Specifically, resistors 29 are connected by a respective connection between source connection of the PMOS cascode transistors 12, 13 and drain connection of the NMOS cascode transistors 14, 15, while they are connected to one another by a respective further connection and form the connection for providing the common-mode signal 28. Via the further resistors 55, this symmetrical circuit node between PMOS and NMOS cascode stage 12, 13; 14, 1.5 is connected to the signal output 8, 9, at which a divided-down current signal is thus provided. Accordingly, all that is present at this output is the current component resulting from the current division of resistance of the resistor 29 divided by the sum of the resistances of the resistors 29 and 55, if, as explained later, no further current division or reduction by further current paths 20, 30 is effected.

As already explained with respect to FIG. 1, a control loop 40 is provided, with a differential amplifier 41, 42, and also NMOS transistors 43, 44, 45, 46, the PMOS transistor 47 connected as a diode, the current mirror transistor 48 and the stabilization elements 49, 50. The precise interconnection of the aforesaid components of the control loop 40 has already been explained in terms of construction and function for FIG. 1 and will not be repeated again at this point. In contrast to the circuit in accordance with FIG. 1, however, the means for stabilization 49, 50 couple not only into the second current path but also into the first current path in the circuit node between PMOS and NMOS cascode transistors.

Furthermore, in contrast to the circuit in accordance with FIG. 1, in the case of the developed circuit in accordance with FIG. 2, a further, third current branch 30 is provided, which is connected in parallel with the first and second current paths 10, 20, the PMOS current source transistors 18, 19 once again being concomitantly used, and said third current branch is likewise of symmetrical design. The third current path 30 has in each case a series circuit formed by PMOS cascode transistors 32, 33, NMOS cascode transistors 34, 35 and NMOS current source transistors 36, 37 with an interconnection analogous to the first and second current paths. The third current path 30 operates as a current sink for reducing the output current of the interface circuit. For this purpose, the symmetrical circuit node formed between PMOS and NMOS cascode stages 32, 33; 34, 35 is connected via a respective resistor 31 to the connection 29 for providing the common-mode signal.

Since the bias stage 51—likewise present in FIG. 2—is connected to the PMOS and NMOS cascode stages of the first to third current branches 10 to 30 in each case independently of one another, a changeover between second and third current paths 20, 30 is made possible in this way. In this case, the first current path 10, at which the output signal of the circuit can be derived, is always active, except if appropriate during the current-saving mode. A control input 53 is provided at the bias stage 51 for said current-saving mode. In addition to the current reference input 52—likewise provided at the bias stage 53, a changeover input 54 for changing over the current gain or attenuation of the present interface circuit is made possible, which in turn permits the processing of the signals with a large dynamic range as already mentioned in the introduction.

While the current branches 10, 20 in FIG. 1 are dimensioned differently, the current paths 20, 30 in accordance with FIG. 2 are connected in parallel and dimensioned identically. The outputs of the cascode stages 22 to 25 in the second current path 20 are directly coupled to the output of the cascode stages in the first current path 10. The outputs of the cascode stages in the third current path 30, by contrast, are coupled, as already described, to the cascode stage in the $1^{st}$ current path for common-mode rejection via resistors 31. In addition to the above-described current divider 29, 55 in the first current path 10, the current divider ratio can now be altered further by optional connection or disconnection of the second or third current path 20, 30. If more than two division ratios of the current divider are desired, it is possible to extend the circuit in accordance with FIG. 2 in a manner that is obvious to a person skilled in the art with knowledge of the circuit in accordance with FIG. 2. The PMOS cascode stages 12, 13, 22, 23, 32, 33 can be disconnected by means of the current-saving mode signal that can be fed in at the control input 53. In addition, however, the PMOS cascode stages 22, 23 or 32, 33 can be disconnected individually in order to obtain the current divider ratio changeover described.

In this case, the disconnection of the second current path 20 and connection of the third current path 30 effects in addition to the current division in the current divider 28, 55, a further attenuation or dividing-down of the output current of the interface circuit, for example in the case of a particularly strong reception signal. However, less noise is generated in the output signal as a result of the current division prescribed by the resistors 29 and 55 than as a result of a current division by changing over current paths to the same output current.

The invention claimed is:

1. An interface circuit for connection to an output of a frequency converter, comprising:
    a signal input;
    a signal output;
    a first current path, which couples the signal input to the signal output and comprises at least one cascode stage;
    a second current path, which comprises a cascode stage connected in parallel with the cascode stage of the first current path;
    one of the first and second current paths having a connection for receiving a common-mode signal; and
    a third current path, which comprises a cascode stage coupled in parallel with the cascode stages of the first and second current paths, the cascode stages in the second and third current paths each having a control input connected to a bias stage that is operable for changing over between the second and third current paths.

2. The interface circuit as claimed in claim 1, wherein the bias stage has an output coupled to the cascode stages in the first and second current paths for supplying bias voltage.

3. The interface circuit as claimed in claim 2, wherein the bias stage has a control input and is responsive to a control signal at the control input thereof for putting the interface circuit into a current-saving mode.

4. The interface circuit as claimed in claim 3, including a current divider which couples the signal output, the connection for providing a common-mode signal, and the cascode stage in the first current path.

5. The interface circuit as claimed in claim 2, including a current divider which couples the signal output, the connection for providing a common-mode signal, and the cascode stage in the first current path.

6. The interface circuit as claimed in claim 1, including a current divider which couples the signal output, the connection for providing a common-mode signal, and the cascode stage in the first current path.

7. The interface circuit as claimed in claim 6, including a control loop for common-mode rejection, having a control input connected to the connection for providing a common-mode signal, and having an output coupled to the signal input.

8. The interface circuit as claimed in claim 7, wherein the bias stage has an output coupled to the cascode stages in the first and second current paths for supplying bias voltage.

9. The interface circuit as claimed in claim 8, wherein the bias stage has a control input and is responsive to a control signal at the control input thereof for putting the interface circuit into a current-saving mode.

10. The interface circuit as claimed in claim 1, including a control loop for common-mode rejection, having a control input connected to the connection for providing a common-mode signal, and having an output coupled to the signal input.

11. The interface circuit as claimed in claim 10, wherein the bias stage has an output coupled to the cascode stages in the first and second current paths for supplying bias voltage.

12. The interface circuit as claimed in claim 11, wherein the bias stage has a control input and is responsive to a control signal at the control input thereof for putting the interface circuit into a current-saving mode.

13. The interface circuit as claimed in claim 12, wherein the control loop for common-mode rejection comprises means for stabilizing the control loop.

14. The interface circuit as claimed in claim 13, including a current divider which couples the signal output, the connection for providing a common-mode signal, and the cascode stage in the first current path.

15. The interface circuit as claimed in claim 11, wherein the control loop for common-mode rejection comprises means for stabilizing the control loop.

16. The interface circuit as claimed in claim 15, including a current divider which couples the signal output, the connection for providing a common-mode signal, and the cascode stage in the first current path.

17. The interface circuit as claimed in claim 10, wherein the control loop for common-mode rejection comprises means for stabilizing the control loop.

18. The interface circuit as claimed in claim 17, including a current divider which couples the signal output, the connection for providing a common-mode signal, and the cascode stage in the first current path.

19. The interface circuit as claimed in claim 1, wherein the signal input, the signal output and the current paths are for processing symmetrical signals.

* * * * *

UNITED STATES PATENT AND TRADEMARK OFFICE
CERTIFICATE OF CORRECTION

PATENT NO.         : 7,126,424 B2                                       Page 1 of 1
APPLICATION NO.    : 10/482720
DATED              : October 24, 2006
INVENTOR(S)        : Peter Klein, Bernhard Lustig and Dieter Sewald It is certified that error appears in the above-identified patent and that said Letters Patent is hereby corrected as shown below:

Title Page

Page 1: (73) Assignee - Please replace the company name "Infineon Technologies Inc."

with --Infineon Technologies AG--.

Signed and Sealed this

Nineteenth Day of August, 2008

JON W. DUDAS
*Director of the United States Patent and Trademark Office*